(12) United States Patent
Lin et al.

(10) Patent No.: US 7,327,291 B2
(45) Date of Patent: Feb. 5, 2008

(54) DEVICE AND METHOD FOR VARIABLE LENGTH DECODING

(75) Inventors: Roger Lin, Xindian (TW); Ting-Kun Yeh, Xindian (TW); Martin Hsu, Xindian (TW); Roy Wang, Xindian (TW); Kuei-Lan Lin, Xindian (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/385,850

(22) Filed: Mar. 22, 2006

(65) Prior Publication Data

US 2007/0040714 A1    Feb. 22, 2007

(30) Foreign Application Priority Data

Aug. 16, 2005    (TW)    .............................. 94127852 A (51) Int. Cl.
 *H03M 7/40* (2006.01)
(52) U.S. Cl. .......................................... 341/67; 341/65
(58) Field of Classification Search ............. 341/50–90
 See application file for complete search history.

(56) References Cited

U.S. PATENT DOCUMENTS

| 5,245,338 | A | | 9/1993 | Sun ............................... 341/67 |
|---|---|---|---|---|
| 5,901,177 | A | * | 5/1999 | Sohn ............................. 341/67 |
| 5,933,536 | A | * | 8/1999 | Fukuzawa ..................... 341/67 |
| 5,949,356 | A | * | 9/1999 | Kim et al. ..................... 341/67 |
| 6,011,498 | A | * | 1/2000 | Wittig .......................... 341/67 |
| 7,075,462 | B2 | * | 7/2006 | Sudharsanan ................. 341/67 |

* cited by examiner

*Primary Examiner*—Lam T. Mai
(74) *Attorney, Agent, or Firm*—Troxell Law Office, PLLC (57) ABSTRACT

An device and method for variable length decoding. The device comprises a device for variable length decoding comprising a first register, a second register, a first barrel shifter, a buffer, a coding table and an adding device. The method is characterized in that the buffer is installed on the output path from the barrel shifter to the coding table so as to shorten the critical path.

14 Claims, 9 Drawing Sheets

| Code-Word | Code-Bit | Code-Length |
|---|---|---|
| a | 00 | 2 |
| b | 01 | 2 |
| c | 100 | 3 |
| d | 101 | 3 |
| e | 110 | 3 |
| f | 1110 | 4 |
| g | 11110 | 5 |
| h | 11111 | 5 |

| Lenght | BS0 Output | Lenght | BS0 Output |
|---|---|---|---|
| 0 | D0[15:0] | 9 | {D0[6:0], 9' b0} |
| 1 | {D0[14:0], 1' b0} | 10 | {D0[5:0], 10' b0} |
| 2 | {D0[13:0], 2' b0} | 11 | {D0[4:0], 11' b0} |
| 3 | {D0[12:0], 3' b0} | 12 | {D0[3:0], 12' b0} |
| 4 | {D0[11:0], 4' b0} | 13 | {D0[2:0], 13' b0} |
| 5 | {D0[10:0], 5' b0} | 14 | {D0[1:0], 14' b0} |
| 6 | {D0[9:0], 6' b0} | 15 | {D0[0], 15' b0} |
| 7 | {D0[8:0], 7' b0} | 16 | 16' b0 |
| 8 | {D0[7:0], 8' b0} | 17 | 16' b0 |

FIG. 6A

| BSW | BS1 Output | BSW | BS1 Output |
|---|---|---|---|
| 1 | {15' b0, D1[15]} | 17 | D1[14:0], D2[15]} |
| 2 | {14' b0, D1[15:14]} | 18 | D1[13:0], D2[15:14]} |
| 3 | {13' b0, D1[15:13]} | 19 | D1[12:0], D2[15:13]} |
| 4 | {12' b0, D1[15:12]} | 20 | D1[11:0], D2[15:12]} |
| 5 | {11' b0, D1[15:11]} | 21 | D1[10:0], D2[15:11]} |
| 6 | {10' b0, D1[15:10]} | 22 | D1[9:0], D2[15:10]} |
| 7 | {9' b0, D1[15:9]} | 23 | D1[8:0], D2[15:9]} |
| 8 | {8' b0, D1[15:8]} | 24 | D1[7:0], D2[15:8]} |
| 9 | {7' b0, D1[15:7]} | 25 | D1[6:0], D2[15:7]} |
| 10 | {6' b0, D1[15:6]} | 26 | D1[5:0], D2[15:6]} |
| 11 | {5' b0, D1[15:5]} | 27 | D1[4:0], D2[15:5]} |
| 12 | {4' b0, D1[15:4]} | 28 | D1[3:0], D2[15:4]} |
| 13 | {3' b0, D1[15:3]} | 29 | D1[2:0], D2[15:3]} |
| 14 | {2' b0, D1[15:2]} | 30 | D1[1:0], D2[15:2]} |
| 15 | {1' b0, D1[15:1]} | 31 | D1[0], D2[15:1]} |
| 16 | {D1[15:0]} | 32 | D2[15:0]} |

FIG. 6B

| Length | Data Selector Output | Length | Data Selector Output |
|---|---|---|---|
| 0 | BS0[15:0] | 9 | {BS0[15:9], BS1[8:0]} |
| 1 | {BS0[15:1], BS1[0]} | 10 | {BS0[15:10], BS1[9:0]} |
| 2 | {BS0[15:2], BS1[1:0]} | 11 | {BS0[15:11], BS1[10:0]} |
| 3 | {BS0[15:3], BS1[2:0]} | 12 | {BS0[15:12], BS1[11:0]} |
| 4 | {BS0[15:4], BS1[3:0]} | 13 | {BS0[15:13], BS1[12:0]} |
| 5 | {BS0[15:5], BS1[4:0]} | 14 | {BS0[15:14], BS1[13:0]} |
| 6 | {BS0[15:6], BS1[5:0]} | 15 | {BS0[15], BS1[14:0]} |
| 7 | {BS0[15:7], BS1[6:0]} | 16 | {BS1[15:0]} |
| 8 | {BS0[15:8], BS1[7:0]} | 17 | {BS1[15:0]} |

FIG. 6C

Input Data Pattern:
$I_1$:0000000000000000, $I_2$:0100000000110000, $I_3$:1001100010011000, $I_4$:0000000001011000, $I_5$:1000000000101000,
$I_6$:0000000000100100, $I_7$:0000000000010001, $I_8$:0000000000001000, $I_9$:0000000010000100, $I_{10}$:0000101001000001,
$I_{11}$:0000010000000100, $I_{12}$:1100001010001000, $I_{13}$:0001100010000100, $I_{14}$:1000000000100000, $I_{15}$:0000000100001000,
$I_{16}$:0000001000000110, $I_{17}$:0000000000000000

| CLK | D0 | BS | D1 | D2 | LD | Note | LUTlen | B | PBSW | A | Length | BSW |
|---|---|---|---|---|---|---|---|---|---|---|---|---|
| 0 | | | | | | | 0 | 0 | 0 | 0 | 0 | 0 |
| 1 | | 0000000000110000 | | 0000000000110000 | 1 | Din=>D2 | 0 | 0 | 0 | 0 | 0 | 0 |
| 2 | 0000000000110000 | X | 0000000000000000 | 0100000000000000 | 1 | Din=>D2, D2=>D1 | 0 | 0 | 0 | 0 | 0 | 0 |
| 3 | 0000000000110000 | 0100000000000000 | 0100000000000000 | 1001100010011000 | 0 | Table, Din=>D2, D2=>D1 | 16 | 16 | 0 | 0 | 16 | 16 |
| 4 | 0100000000000000 | X | 1001100010011000 | 0000000001011000 | 1 | BS | 16 | 0 | 0 | 0 | 16 | 16 |
| 5 | 0100000000000000 | 0000000000010011 | 1001100010011000 | 0000000001011000 | 0 | Table, Din=>D2, D2=>D1 | 5 | 5 | 0 | 5 | 5 | 5 |
| 6 | 0000000000010011 | X | 1001100010011000 | 0000000001011000 | 0 | BS | 5 | 0 | 5 | 5 | 5 | 5 |
| 7 | 0000000000010011 | 0010011000000000 | 1001100010011000 | 0000000001011000 | 1 | Table | 17 | 17 | 5 | 5 | 17 | 22 |
| 8 | 0010011000000000 | X | 0000000001011100 | 1000000000010100 | 0 | BS | 17 | 0 | 6 | 6 | 17 | 23 |
| 9 | 0010011000000000 | 0000000000101100 | 0000000001011100 | 1000000000010100 | 0 | Table, Din=>D2, D2=>D1 | 9 | 9 | 15 | 6 | 9 | 15 |
| 10 | 0000000000101100 | X | 0000000000101100 | 1000000000010100 | 0 | Table | 9 | 0 | 15 | 15 | 9 | 24 |
| 11 | 0000000000101100 | 0100000000010000 | 0000000000101100 | 1000000000010100 | 1 | BS | 16 | 16 | 15 | 15 | 16 | 31 |
| 12 | 0100000000010000 | X | 1000000000101000 | 0000000000100100 | 0 | Table, Din=>D2, D2=>D1 | 16 | 0 | 15 | 15 | 16 | 31 |
| 13 | 0100000000010000 | 0000001010000000 | 1000000000101000 | 0000000000100100 | 1 | BS | 5 | 5 | 4 | 15 | 5 | 20 |
| 14 | 0000001010000000 | X | 0000000000100100 | 0000000000100001 | 0 | Table, Din=>D2, D2=>D1 | 11 | 0 | 4 | 4 | 5 | 9 |
| 15 | 0000001010000000 | 0000000000010100 | 0000000000100100 | 0000000000010001 | 0 | BS | 11 | 11 | 15 | 4 | 11 | 15 |

FIG. 7A

| CLK | D0 | BS | D1 | D2 | LD | Note | LUTlen | B | PBSW | A | Length | BSW |
|---|---|---|---|---|---|---|---|---|---|---|---|---|
| 16 | 00000000100100 | X | 0000000000100 | 00000000000010001 | 0 | Table | | | | | | |
| 17 | 00000000010010 | 00000000000010001 | 0000000000100 | 00000000000010001 | 1 | BS, (Load 2 times) | 17 | 0 | 15 | 15 | 11 | 26 |
| 18 | 00000000001001 | X | X | 00000000000001000 | 1 | Table, Din=>D2 | 17 | 17 | 0 | 15 | 17 | 32 |
| 19 | 00000000010001 | 00000000000010000 | 00000000000001000 | 00000010000000100 | 1 | BS, Din=>D2, D2=>D1 | 17 | 0 | 0 | 0 | 17 | 17 |
| 20 | 00000000010001 | X | 00000010000000100 | 00001010010001001 | 0 | Table, Din=>D2, D2=>D1 | 17 | 17 | 1 | 0 | 17 | 17 |
| 21 | 00000000010000 | 000001000001000 | 00000100000100 | 00001010010001001 | 1 | BS | 17 | 0 | 1 | 1 | 17 | 18 |
| 22 | 00000100001000 | 0010100100000100 | 00000100001000 | 00001000000000100 | 1 | MP2esc, Din=>D2, D2=>D1 | 8 | 16 | 2 | 2 | 16 | 18 |
| 23 | 00101001000010 | 000010000010000 | 00001010000100 | 11000010000001000 | 0 | BS, Din=>D2, D2=>D1 | 0 | 8 | 10 | 2 | 8 | 10 |
| 24 | 00000100010000 | 000100100001000 | 00000110010000100 | 11000010100001000 | 1 | MP2esc | 8 | 16 | 10 | 10 | 16 | 26 |
| 25 | 00010010100010 | 000000100010010 | 11000000010000 | 00110000000010000 | 1 | BS, Din=>D2, D2=>D1 | 0 | 8 | 2 | 10 | 8 | 18 |
| 26 | 00000100010000 | 01100010100000 | 01000110000000 | 0000000000100000 | 1 | MP1esc, Din=>D2, D2=>D1 | 4 | 16 | 2 | 2 | 16 | 18 |
| 27 | 01100001000010 | 00000010010000 | 01000000100000 | 00000010001000 | 0 | BS, Din=>D2, D2=>D1 | 0 | 4 | 6 | 2 | 4 | 6 |
| 28 | 00000100010000 | 0000100000000 | 00000000100000 | 00000100001000 | 1 | MP1esc | 12 | 16 | 6 | 6 | 16 | 22 |
| 29 | 00000100010000 | 00000010000100 | 00000010000100 | 0000100001000 | 1 | BS, Din=>D2, D2=>D1 | 0 | 12 | 2 | 6 | 12 | 18 |
| 30 | 00000100010000 | 00001000011000 | 00000000000110 | 00000100001000 | 1 | MP1esc, Din=>D2, D2=>D1 | 12 | 16 | 2 | 2 | 16 | 18 |
| 31 | 00001000000100 | 10000000000000 | 00000000000000 | 00000000000000 | 0 | BS, Din=>D2, D2=>D1 | 0 | 12 | 14 | 2 | 12 | 14 |

FIG. 7B

DEVICE AND METHOD FOR VARIABLE LENGTH DECODING

BACKGROUND OF THE INVENTION

1. Field of the Invention

The present invention generally relates to a device and a method for variable length decoding and, more particularly, to a device and a method for variable length decoding used in a high compression-ratio video system for shortening the critical path.

2. Description of the Prior Art

Variable Length Coding (VLC) is widely adopted in many compression systems, such as JPEG (Joint Photographic Experts Group) and MPEG (Moving Picture Experts Group). Accordingly, a variable length decoder (VLD) is also required in a compression system so as to decode the variable length coding. The VLD circuit was proposed early in 1991 to comprise registers, barrel shifters (BS) and a VLC table.

Figure 1:
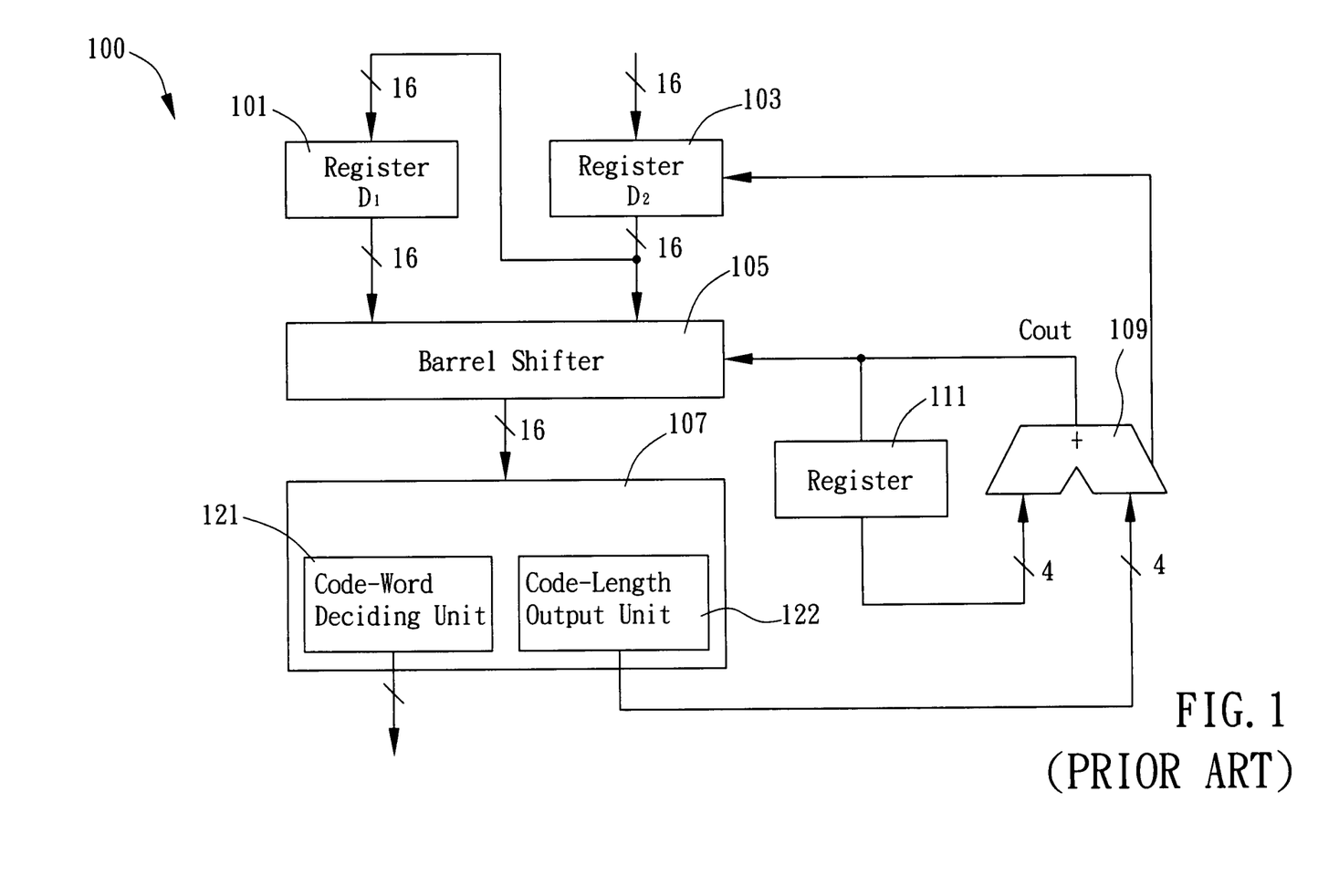
FIG. 1 is a circuit diagram showing a conventional VLD circuit.

Please refer to FIG. 1, which is a circuit diagram showing a conventional VLD circuit. In FIG. 1, the VLD circuit 100 comprises 16-bit registers D1 101, D2 103, a barrel shifter 105, a VLD table 107, an adding device 109 and a register 111. The barrel shifter 105 receives 32-bit input data from the 16-bit registers D1 101, D2 103. The barrel shifter 105 selects from the 32-bit data by shifting the contents in the registers D1 101, D2 103 and outputs 16-bit data to the VLD table 107 for decoding.

More particularly, the VLD table 107 includes a code-word deciding unit 121 and a code-length output unit 122. When the VLD table 107 receives 16-bit data from the barrel shifter 105, the code-word deciding unit 121 determines the bits to be decoded. Accordingly, the code-length output unit 122 outputs the code-length in a 4-bit data to the adding device 109. The adding device 109 accumulates according to the code-length. In other words, the sum output by the adding device 109 is added to the output of the adding device 109 through the feedback path. The accumulated sum is also stored in the register 111. The output sum in a 4-bit data by the adding device 109 controls the shifting of the barrel shifter 105 so that the barrel shifter 105 selects 16-bit data from the 32-bit data. The carry (Cout) output from the adding device 109 controls the timing at which new 16-bit data is read from the register 103.

Therefore, when the 16-bit data is read from the register 103, the data is loaded from the register 103 into the register D1 101 and the register D2 103. The data loaded in the register D1 101 and the register D2 103 is then input into the barrel shifter 105. The barrel shifter 105 decodes according to the 16-bit data input to the VLD table 107. Then, the VLD table 107 decodes according to the 16-bit data and outputs the code-word and the code-length.

Figure 2:
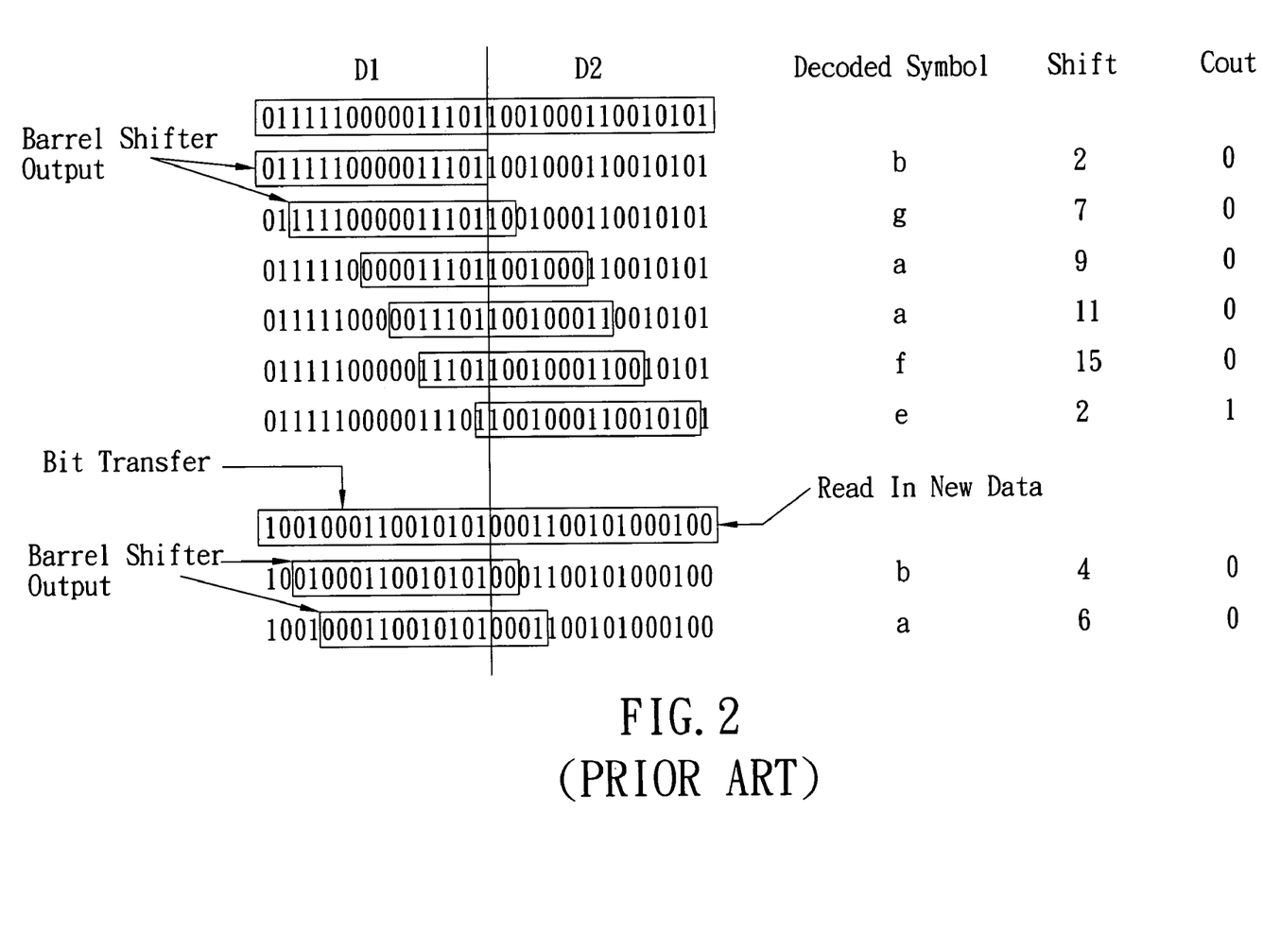
FIG. 2 is an example of conventional VLC decoder operations.
Figure 3:
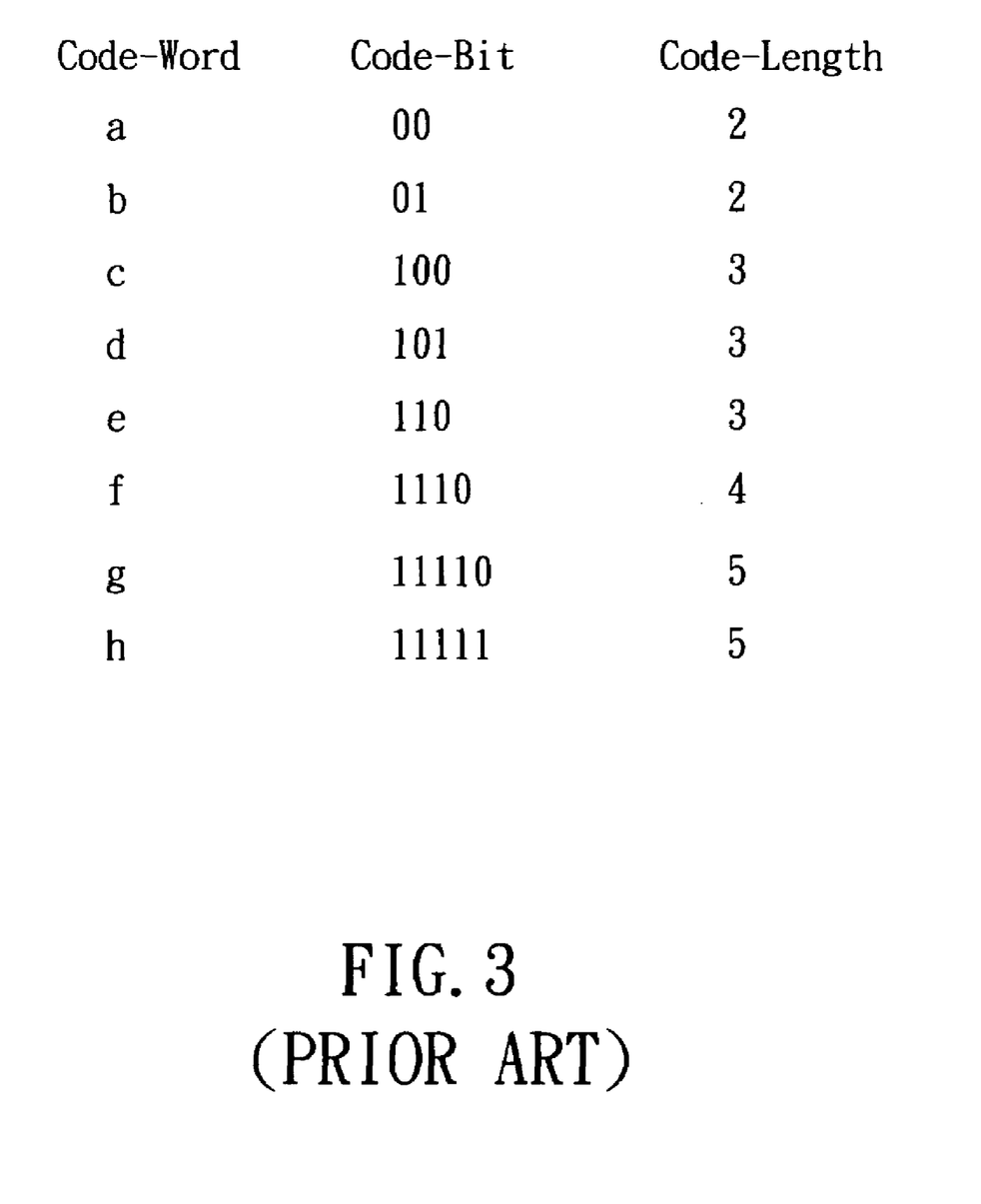
FIG. 3 is an example of the, conventional VLC table.

Please also refer to FIG. 2 and FIG. 3. FIG. 2 is an example of conventional VLC decoder operations that the barrel shifter 105 shifts its opening windows to the next code-word according to the accumulated code-length. FIG. 3 is an example of the VLC table 107. In FIG. 2, the barrel shifter 105 includes the $0^{th}$~the $31^{st}$ zones so as to store the input 32-bit data from the register D1 101 and the register D2 103. The undecoded bits appear at the output of the barrel shifter 105, as shown in each framed row from top to bottom in FIG. 2. At the beginning, the undecoded bits are 0111110000011101, which are determined by the code-word deciding unit 121 according to FIG. 3 that the $16^{th}$ and $15^{th}$ bits "01" correspond to "b" in FIG. 3, resulting in a code-length of 2. The accumulated shift is 2. Therefore, in the next decoding cycle, the barrel shifter 105 shifts 2 bits to the right and the undecoded bits are 1111000001110110. It is determined by the code-word deciding unit 121 that, according to FIG. 3, the $16^{th}$ to $12^{th}$ bits "11110" correspond to "g" in FIG. 3, resulting in a code-length of 5. The accumulated shift is 7.

Similarly, in the next decoding cycle, the barrel shifter 105 shifts 7 bits to the right and the undecoded bits are 0000111011001000. It is determined by the code-word deciding unit 121 that, according to FIG. 3, the $16^{th}$ and $15^{th}$ bits "00" correspond to "a" in FIG. 3, resulting in a code-length of 2. The accumulated shift is 9.

As the accumulated shift is as much as 15, the barrel shifter 105 shifts 15 bits to the right and the undecoded bits are 1100100011001010. It is determined by the code-word deciding unit 121 that, according to FIG. 3, the $16^{th}$ and $14^{th}$ bits "110" correspond to "e" in FIG. 3, resulting in a code-length of 3. The accumulated shift is 2 with a carry-out bit (Cout) of 1. Meanwhile, only the $0^{th}$ bit "1" of the 32-bit data 01111100000111011001000110010101 from the register D1 101 and the register D2 103 is left undecoded. Therefore, the data in the register D2 103 is loaded into the register D1 102 and a new 16-bit word is loaded into the register D2 103, and the barrel shifter 105 shifts to the new position to prepare for the next decoding cycle.

Generally, when the VLD circuit 100 is used in low-level compression systems with code-length shorter than 16 bits, only one or two clock cycles are required for decoding, assuming that a clock cycle is 7.4 ns for 135 MHz specification. But if the VLD circuit 100 is used in high-level compression systems with code-length longer than 20 bits, the barrel shifter 105 decodes two 16-bit data loaded from the register D2 103. In other words, it takes two or three clock cycles to achieve decoding in high-level compression systems.

The critical path of the conventional VLD circuit 100 is:

the registers D1 101/D2 103→the barrel shifter 105→the VLC table 107→the adding device 109→the registers D1 101/D2 103, which takes two or three clock cycles to achieve decoding and cannot be done in one 7.4-ns clock cycle for 135 MHz specification.

Therefore, there is need in providing a device and a method for variable length decoding so as to shorten the clock cycle for higher frequency systems.

SUMMARY OF THE INVENTION

It is the primary object of the present invention to provide a device for variable length decoding, comprising a first register, a second register, a first barrel shifter, a buffer, a coding table and an adding device.

The first register receives input data so as to output data according to a first control signal. The second register receives data from the first register so as to output data according to the first control signal. The first barrel shifter receives data from the first register, the second register and a buffer so as to output data according to a window shift signal and a second control signal, wherein the buffer receives data from the first barrel shifter so as to output data according to a third control signal. The coding table receives data from the buffer so as to decode data and output a code-word and a code-length of the code-word. The adding device receives the code-length so as to output the window shift signal and the second control signal according to the third control signal.

In one preferred embodiment of the present invention, the first barrel shifter comprises: a second barrel shifter, a third barrel shifter and a data selector. The second barrel shifter receives external zero data and data from the second register so as to output data according to the second control signal. The third barrel shifter receives data from the first and the second register so as to output data according to the window shift signal. The data selector receives data from the second barrel shifter and the third barrel shifter so as to output data according to the second control signal.

Preferably, the buffer comprises a first multiplexer and the third register. The first multiplexer receives data from the first barrel shifter and a third register so as to output data according to the third control signal. The third register receives data from the first multiplexer so as to output data from the buffer.

Preferably, the coding table comprises a code-word deciding unit and a code-length output unit. The code-word deciding unit receives data from the buffer so as to decode data and output the code-word. The code-length output unit outputs the code-length of the code-word, wherein the buffer outputs a fourth control signal.

Preferably, the device for variable length decoding further comprises a node and a second multiplexer. The node receives data from the first barrel shifter and the buffer so as to output data. The second multiplexer receives the code-word and data from the node so as to output data according to the fourth control signal.

Preferably, the adding device comprises a third multiplexer, an adder and a fourth register. The third multiplexer receives the code-length and an external pre-bitstream so as to output the second control signal according to the third control signal and the fourth control signal. The adder receives the second control signal and data from the fourth register so as to output the window shift signal. The fourth register receives data from the adder. The the external pre-bitstream comprises a first pre-bitstream, a second pre-bitstream, a third pre-bitstream and a fourth pre-bitstream.

Preferably, the third multiplexer comprises a fourth multiplexer, a fifth multiplexer, a fifth register, a sixth multiplexer and a seventh multiplexer. The fourth multiplexer receives the first pre-bitstream and the second pre-bitstream so as to output data according to a fifth control signal. The fifth multiplexer receives the code-length and data from the fourth multiplexer so as to output data according to the fourth control signal. The fifth register receives the data from the fifth multiplexer. The sixth multiplexer receives the third pre-bitstream and the fourth pre-bitstream so as to output data according to the fourth control signal. The seventh multiplexer receives data from the fifth register and the sixth multiplexer so as to output the first control signal according to the third control signal.

It is the secondary object of the present invention to provide a method for variable length decoding, characterized in that: a buffer is installed on the path from a first barrel shifter to a coding table so as to adjust a critical path during variable length decoding. The method comprises a step of: using a clock signal so as to control an output clock signal from the buffer.

In one preferred embodiment of the present invention, data is loaded from a first register and a second register into the first barrel shifter. Data is loaded from the buffer into the first barrel shifter. Data is selected from the first register, the second register and the buffer by window shifting so as to output data to the buffer.

Preferably, data is received from the buffer so as to decode the data and output a code-word and a code-length from a coding table. The code-length is accumulated using an adding device so as to control window shifting and data from the first register and the second register.

Preferably, the first barrel shifter is formed using a second barrel shifter, a third barrel shifter and a data selector. Date is received from the buffer and external zero data using the second barrel shifter, and receiving data from the first register and the second register using the third barrel shifter. Data is selected from the second barrel shifter and the third barrel shifter using window shifting into the data selector. Data is output from the data selector controlled by the code-length.

Preferably, a control signal is provided so as to control window shifting when a particular byte occurs during decoding by the coding table. Data from the first barrel shifter and data from the buffer is combined.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiment of the present invention will be readily understood by the accompanying drawings and detailed descriptions.

DETAILED DESCRIPTION OF THE INVENTION

The present invention providing a device and a method for variable length decoding can be exemplified by the preferred embodiment as described hereinafter.

Figure 4:
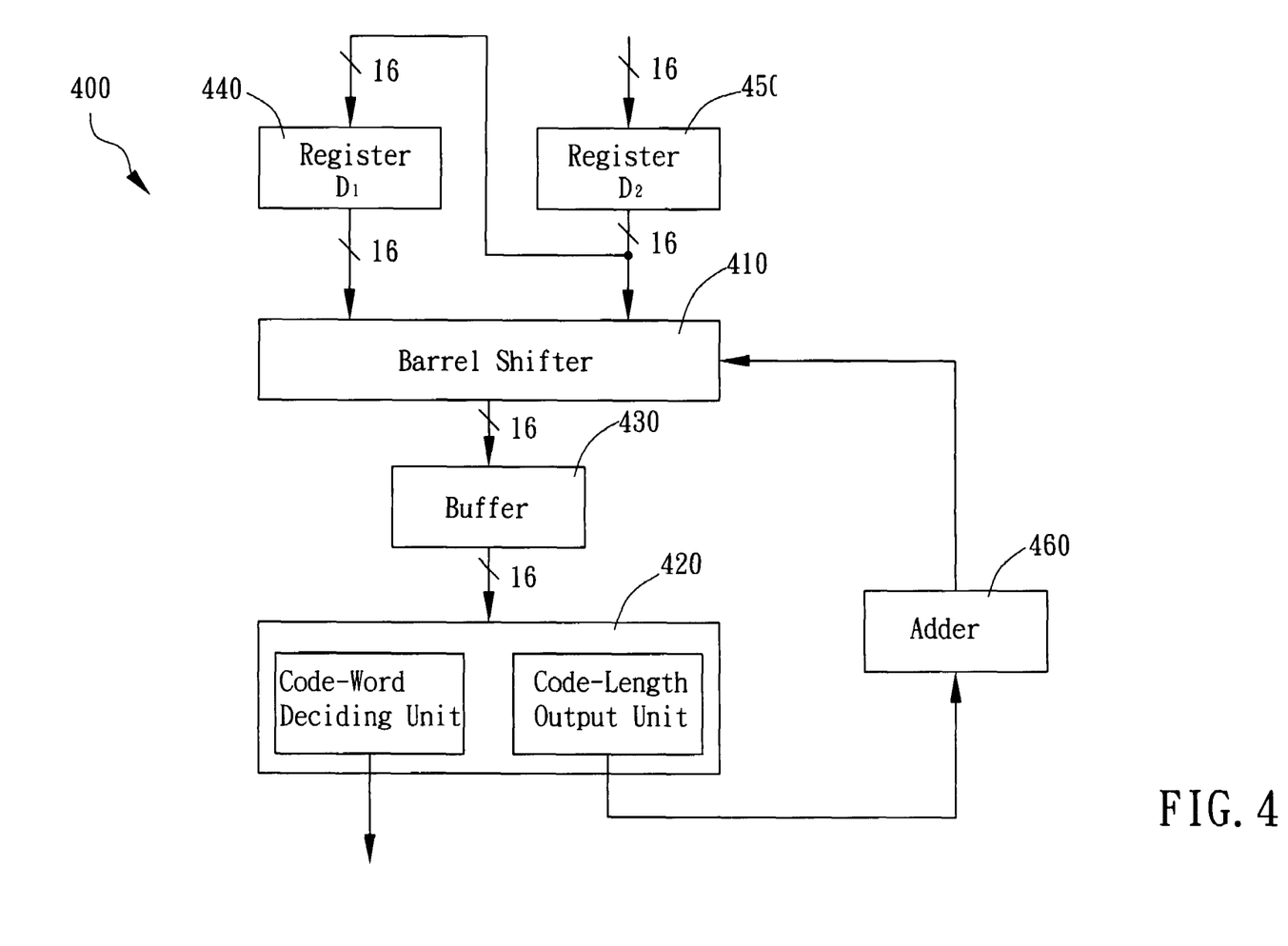
FIG. 4 is a schematic circuit diagram showing a VLD circuit according to the present invention.

Please refer to FIG. 4, which is a schematic circuit diagram showing a VLD circuit according to the present invention. In FIG. 4, the VLD circuit 400 is characterized in that a buffer 430 is installed on the path from a first barrel shifter 410 to a coding table 420. With the buffer 430, the path between the first barrel shifter 410 and the coding table 420 is buffered when the undecoded bits are insufficient. Therefore, decoding on the path between the first barrel shifter 410 and the coding table 420 is done with two clock cycles instead of one clock cycle in the prior art.

Accordingly, the critical path of the VLD circuit 400 is divided into the registers D1 440/D2 450→the first barrel shifter 410→the buffer 430, and also the buffer 430→the coding table 420→the adding device 460→the registers D1 440/D2 450, rather than the prior-art critical path as shown in FIG. 1 the registers D1 101/D2 103→the barrel shifter 105→the VLC table 107→the adding device 109→the registers D1 101/D2 103.

Therefore, in the present invention, each of the divided segments is done using half the time it is done in the prior art.

In other words, the VLD circuit 400 requires only half the time to complete each of the divided segments of the critical path and thus the working frequency doubles that in the prior art.

Figure 5:
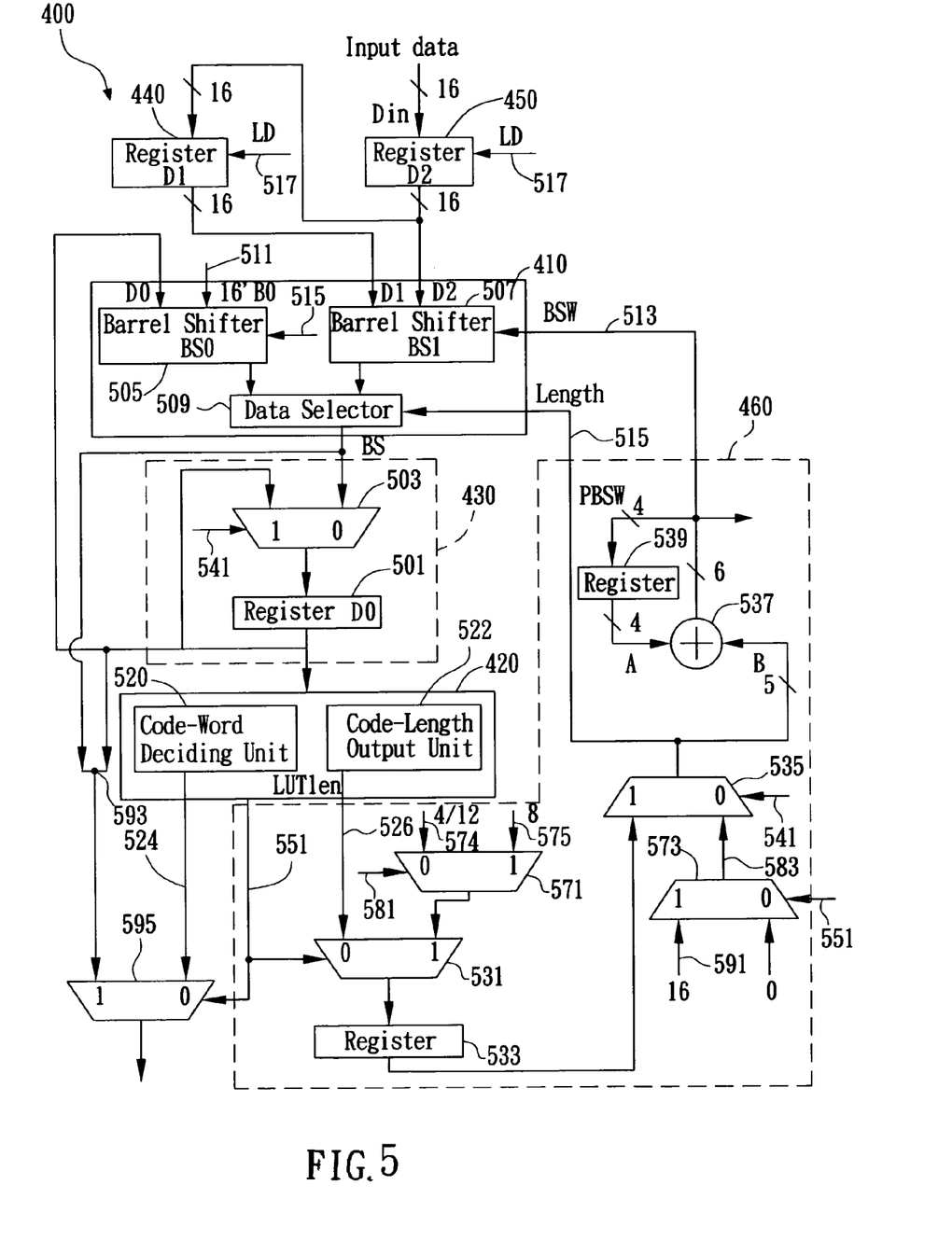
FIG. 5 is a detailed circuit diagram showing a VLD circuit according to the present invention.

Please also refer to FIG. 5, which is a detailed circuit diagram showing a VLD circuit according to the present invention. In one embodiment of the present invention, when the undecoded bits are insufficient during window shifting of the first barrel shifter 410, the buffer 430 uses a register D0 501 as a buffer and output data from the register D0 501 as input into the first barrel shifter 410. Therefore, the data selected by the first barrel shifter 410 during window shifting includes data from the register D0 501, the register D1 440 and the register D2 450. If each of the registers D0 501, D1 440 and D2 450 provides 16-bit data, there are 48-bit data for the first barrel shifter 410 to select using window shifting, which is 16 bits more than that in the prior art.

On the other hand, for the 48-bit data, the first barrel shifter 410 has a different circuit configuration from the conventional prior art. The first barrel shifter 410 comprises a second barrel shifter BS0 505, a third barrel shifter BS1 507 and a data selector 509. The second barrel shifter BS0 505 receives external zero data 511 and data from the second register D0 501 so as to output data according to the second control signal 515. The third barrel shifter BS1 507 receives data from the first register D1 440 and the second register D2 450 so as to output data according to the window shift signal 513 from the adding device 460.

Therefore, in the beginning of the operations of the VLD circuit 400, the second register D2 receives undecoded data and outputs the undecoded data into the first register D1 440 and the second register D2 450 according to the control signal 517, the window shift signal 513 and the second control signal 515. The undecoded data is then loaded into the register D0 501 from the multiplexer 503 and the first barrel shifter 410. The second barrel shifter BS0 505 and the third barrel shifter BS1 507 receive data from the second register D0 501, the first register D1 440 and the second register D2 450 according to the window shift signal 513.

More particularly, the second barrel shifter BS0 505 and the third barrel shifter BS1 507 are for 32-bit data, therefore 16-bit zero data 511 is required for window shifting by the second barrel shifter BS0 505 so as to receive data from the register D0 501.

The data from the second barrel shifter BS0 505 and the third barrel shifter BS1 507 is combined to be outputted through the data selector 509 according to the second control signal 515. The combined data is determined whether to be stored in the second register D0 501 from the multiplexer 503 according to the clock signal 541. After the coding table 420 receives data from the second register D0 501, the code-word deciding unit 520 decodes the data and outputs a code-word 524. The code-length output unit 522 outputs a word-length 526 according to the decoded result. In the present invention, the word-length 526 is a 5-bit data representing a word-length of 0~31.

The adding device 460 outputs the second control signal 515 according to the word-length 526. Otherwise, the adder 537 and the register 539 of the adding device 460 output the window shift signal 513.

Since the critical path is shortened by installing the buffer 430 so as to shorten the clock cycle, the VLD circuit 400 is applicable to high-compression system. Moreover, the buffer 430 stores the undecoded data so as to increase available data to be selected by the first barrel shifter 410 using window shifting. Therefore, it only takes a clock cycle for each critical path during decoding by the VLD circuit 400, which is half the time the prior art does.

When the VLD circuit 400 is applied in MPEG1 and MPEG2 systems, the undecoded data is 20 or 28 bits for MPEG1 and 24 bits for MPEG2. It takes three clock cycles for the first barrel shifter 410 to finish decoding. In the present invention, the adding device 460 further comprises multiplexers 531, 535, 551, 557 and a register 533.

The leading bits of the MPEG1 and MPEG2 are generally 000001. When the coding table 420 receives 000001, it is indicated that the input data represent a particular code-word. For example, when the coding table 420 receives the particular bits 000001, the coding table 420 outputs a control signal 551 representing "1" ("1" when particular bits appear, and "0" otherwise) so as to control the multiplexer 531 to receive the response from the multiplexer 571. In other words, the adding device 460 outputs the control signal 515 and the window shift signal 513 according to the data 574 and 575 with code-length of 4/12 and 8 from the control signal 581. The data output from multiplexer 531 according to the control signal 551 representing "1" and the data 583 with code-length of 16 bits output from multiplexer 573 according to the control signal 551 representing "1" are output by the adder 535 according to the clock signal 541 as the control signal 515. Otherwise, the combined data is output by the adder 537 and the register 539 according to the clock signal 541 as the window shift signal 513. In short, when the coding table 420 receives a particular byte 000001, the control signal 515 is obtained by external input code-length of 4/12, 8 plus 16 so as to control the first barrel shifter 410. Accordingly, the third barrel shifter BS1 507 takes only two clock cycles to complete decoding.

Figure 6A:
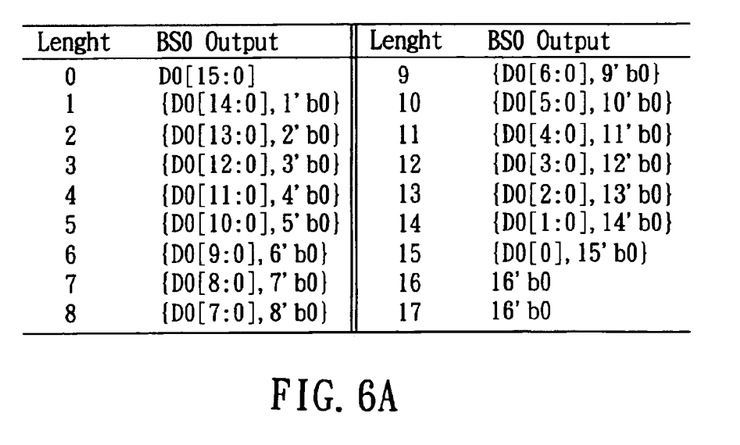
FIG. 6A is a table showing the word-length and the corresponding BS0 output according to the present invention.
Figure 6B:
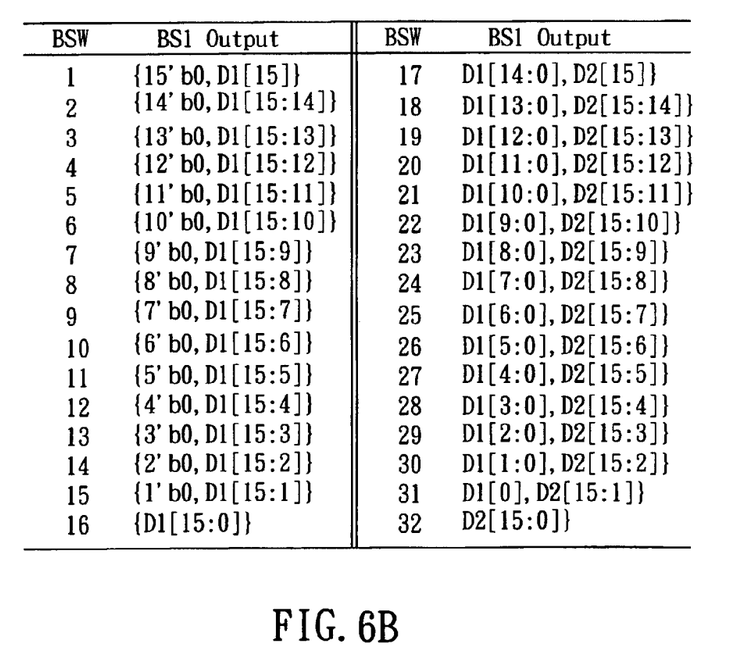
FIG. 6B is a table showing BSW and the corresponding BS1 output according to the present invention.
Figure 6C:
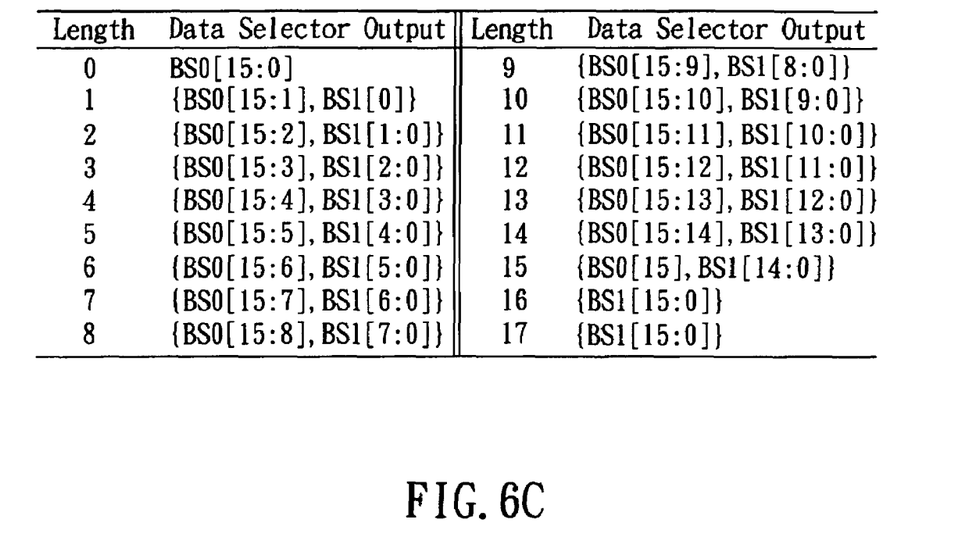
FIG. 6C is a table showing the word-length and the corresponding data selector output according to the present invention.

Please refer to FIGS. 6A~6C, where FIG. 6A is a table showing the word-length and the corresponding BS0 output according to the present invention; FIG. 6B is a table showing BSW and the corresponding BS1 output according to the present invention; and FIG. 6C is a table showing the word-length and the corresponding data selector output according to the present invention.

In FIG. 6A, the control signal 515 (representing the code-length) is denoted by Length. When Length is 0, the barrel shifter BS0 505 selects {D0[15:0]} received by the register D0 501 so as to output. When Length is 1, the barrel shifter BS0 505 selects {D0[14:0]} and a zero bit 1'b0 (i.e., {D0[14:0], 1'b0}) received by the register D0 501 so as to output.

In FIG. 6B, the window shift signal 513 (representing the shift) is denoted by BSW. When BSW is 16, the barrel shifter BS1 507 performs window shifting and selects data from the registers D1 440 and D2 450 so as to output. In other words, when BSW is 16, the barrel shifter BS1 507 selects {D1[15:0]} loaded from the register D1 440 so as to output. When Length is 17, the barrel shifter BS1 507 selects {D1[14:0]} loaded from the register D1 440 and the 15$^{th}$ bit loaded from the register D2 450 (i.e., {D1[14:0], D2[15]} so as to output.

In FIG. 6C, the data selector 509 selects data from the barrel shifter BS0 505 and the barrel shifter BS1 507 according to the control signal 515, representing Length. When Length is 0, the data selector 509 selects {BS0[15:0]} loaded from the barrel shifter BS0 505 so as to output. When Length is 1, the data selector 509 selects the 1$^{st}$ to 15$^{th}$ bits {BS0[15:1]} from the barrel shifter BS0 505 and the 0$^{th}$ bit from the barrel shifter BS1 507 (i.e., {BS0[15:1], BS1[0]}) so as to output.

From FIG. 6A~6C, the barrel shifter 430 comprises the barrel shifter BS0 505, the barrel shifter BS1 507 and the data selector 509 and receives data from the register D0 501, the register D1 440 and the register D2 450 so as to select by window shifting. The first barrel shifter 410 controls window shifting according to the window shift signal 513 and the control signal 515 so as to select undecoded data to output. The window shifting direction is:

Data from the register D0 501→Data from the register D1 440→Data from the register D2 450

Figure 7A:
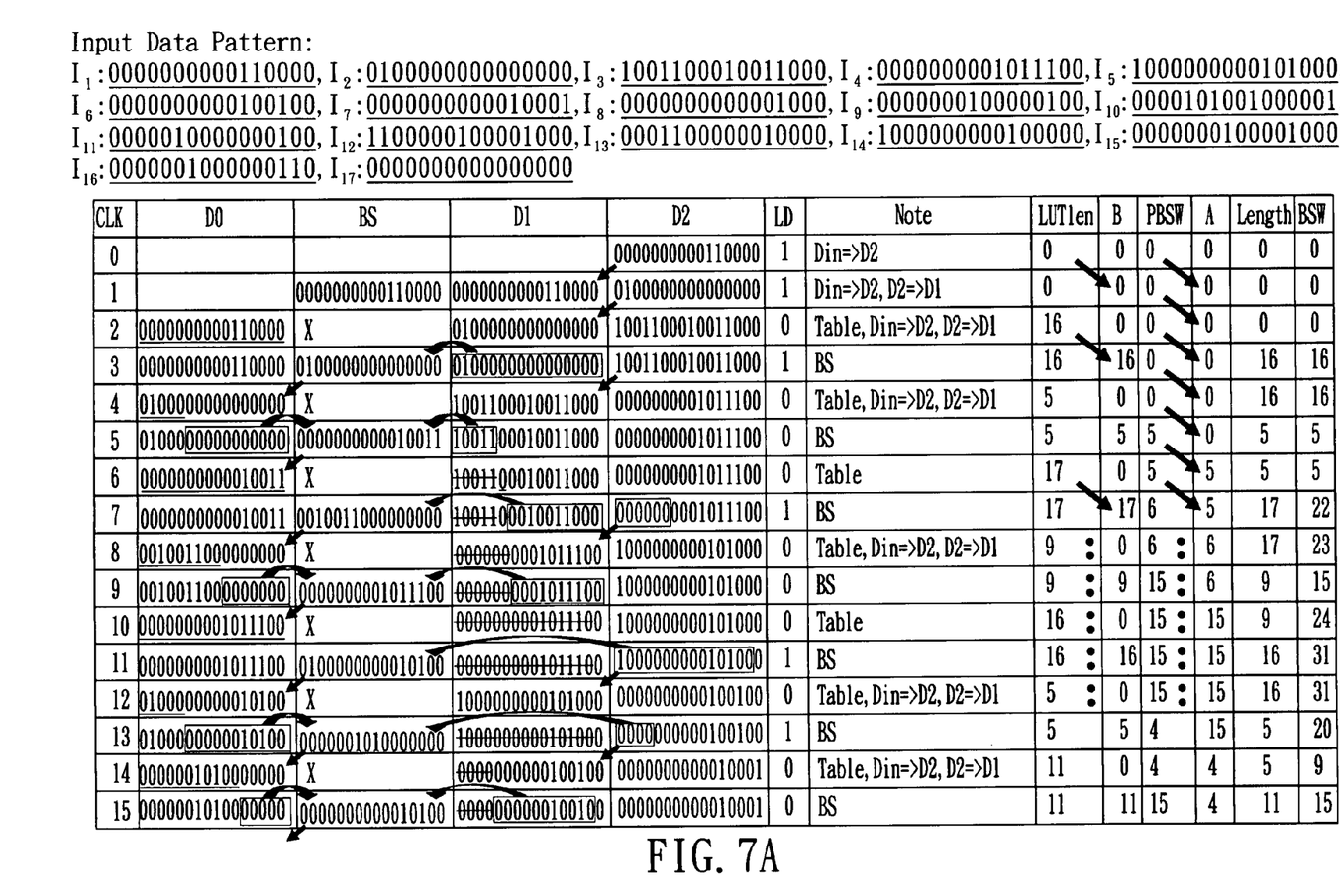
FIGS. 7A and 7B are tables showing the decoding process according to the present invention.
Figure 7B:
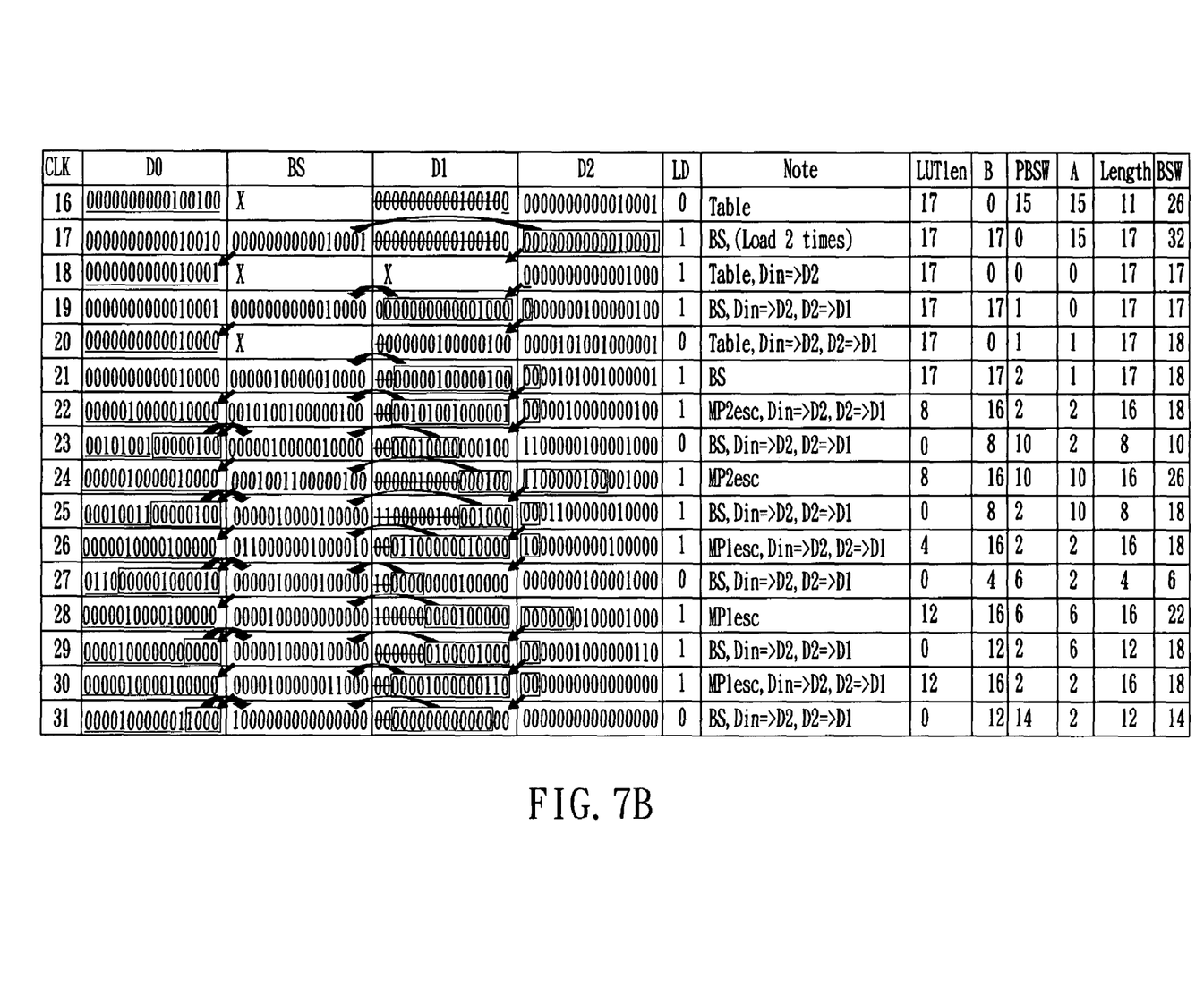

Please also refer to FIG. FIGS. 7A and 7B, which are tables showing the decoding process according to the present invention. The undecoded input data patterns $I_1$~$I_{17}$ are loaded from the register D2 450. The undecoded input data patterns loaded from the registers D0 501, D1 440 and D2 450 are denoted by the columns D0, D1 and D2. The data to be output from the barrel shifter 410 (more specifically, the data selector 509) is denoted by the column BS. LD denotes the control signal 517. LUTlen denotes the code-length 526. B denotes data received by the adder 537. PBSW denotes data received by the register 539. A denotes data output from the register 539. Length denotes the control signal 515. BSW denotes the window shift signal 513. Meanwhile, in the "Note" column, $D_{in}$ denotes the undecoded data, Table denotes decoding by LUT (look-up table), BS denotes window shifting, and MP2esc or MP1esc indicates that a particular byte is detected.

In the beginning, when the clock is 0, the register D2 450 receives $I_1$ (0000000000110000) according to the low-level control signal 517 without window shifting and decoding. Thus, D2 is 0000000000110000; LD is 1; and LUTlen, B, PBSW, A, Length and BSW are all 0.

When the clock is 1, the register D2 450 outputs $I_1$ (0000000000110000) according to the high-level control signal 517 and $I_1$ is stored in the register D1 440. Meanwhile, $I_2$ (0100000000000000) is loaded into and stored in the register D2 450, and the barrel shifter 410 performs window shifting and selects from 00000000000110000 0100000000000000. The window decides [00000000001100001] 0100000000000000, resulting in 0000000000110000 for BS, 0000000000110000 for D1, 0100000000000000 for D2, 1 for LD, 0 for LUTlen, B, PBSW, A, Length and BSW.

When the clock is 2, the data selector 509 outputs 0000000000110000 the register D0 501 for decoding using LUT and $I_2$ (0100000000000000) is loaded into the register D2 450 from the register D1 440. Meanwhile, $I_3$ (100110001001100) is loaded into and stored in the register D2 450, resulting in 0000000000110000 for D0, 0100000000000000 for D1, 1001100010011000 for D2, 0 for LD, B, PBSW, A, Length and BSW. Moreover, LUTlen is 16 because all the bits in 0000000000110000 match the LUT.

Accordingly, the barrel shifter 410 receives simultaneously 48-bit data (00000000001100000 1000000000000000 1001100010011000) stored in the registers D0 510, D1 440 and D2 450 for data selection during window shifting, while the window decides [0000000000011000001] 1000000000000000 1001100010011000, such that all the framed bits match the LUT.

When the clock is 3, the code-length 526 output from the coding table 420 represents a length of 16 bits according to the clock being 2. The code-length 526 remains 16 bits even after being accumulated by the adding device 450, resulting in 16 for LUTlen, B, Length and BSW. Therefore, the barrel shifter 410 shifts the window by 16 bits according to the control signal 517 and the window shift signal 513. The window decides 0000000000110000 [0100000000000000] 1001100010011000, resulting in 0100000000000000 for BS, 0000000000110000 for D0, 1000000000000000 for D1 and 1001100010011000 for D2. The Cout is 1 when the adder 537 of the adding device 460 results in 16. The control signal 517 is high according to the carry-out bit 1 of the adder 537, resulting in 1 for LD.

When the clock is 4, the barrel shifter 410 outputs 0100000000000000 to the register D0 501 for decoding using LUT. Since the control signal 517 turns into low-level from high-level, $I_3$ 1001100010011000 is loaded from the register D2 450 into the register D1 440, while the register D2 450 receives $I_4$ 0000000001011100, resulting in 0100000000000000 for D0, 1001100010011000 for D1, 0000000001011100 for D2, 1 for LD, 0 for B, PBSW and A, and 16 for Length and BSW. Since the 11$^{th}$~15$^{th}$ bits of 0100000000000000 match the LUT, LUTlen is 5.

Similarly, we can obtain 0000010000010000 for D0, 0000101001000001 for D1 and 0000010000000100 for D2 when the clock 22. In other words, the window selects from 0000010000010000 0000101001000001 0000010000000100. Since BS is 0000010000010000, the windows decides [0000010000010000] 0000101001000001 0000010000000100. As a result, 0000010000010000 include a particular byte 000001, which is assumed to be compressed using MPEG2. Meanwhile, the barrel shifter 410 includes 000001 and the next 18 bits so as to output without further decoding using LUT.

Therefore, when a particular code-word is detected (as the clock being 22), the barrel shifter 410 outputs the particular code-word at the clock 22 and the clock 23, and the register D2 450 loads data into the register D2 450 and the register D1 440. The data representing the particular code-word is output from the barrel shifter 410 when the clock is 22 according to the control signal 515, which is the data 591 representing the length of 16 bits received by the multiplexer 531. Therefore, B and Length are both 16. The barrel shifter 410 outputs 16 bits when the clock is 22 and then the barrel shifter 410 outputs 8 bits when the clock is 23. Meanwhile, the multiplexer 571 receives the data 575 representing the length of 8 bits as the control signal 515. B and Length are both 8.

Considering that the detected particular code-word is to be output, the code-word deciding unit 520 of the coding table 420 outputs the 6-bit data 000001, while 8 bits of the other 18 bits are output from the register D0 501 and 10 bits are output from the barrel shifter 410 to be combined as 18-bit data at the node 593 to be output through the multiplexer 595.

It should be known that the VLD circuit 400 is able to decode within two clock cycles when detecting a particular code-word. Therefore, the VLD circuit 400 achieves decoding a particular or non-particular code-word within two clock cycles.

According to the above discussion, the present invention discloses a device and a method for variable length decoding, characterized in that the buffer is installed on the output path from the barrel shifter to the coding table so as to shorten the critical path and achieve decoding within two 7.4-ns clock cycles for 135 MHz specification. Therefore, the present invention has been examined to be, new, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A device for variable length decoding, comprising: a first register, receiving input data so as to output data according to a first control signal; a second register, receiving data from said first register so as to output data according to said first control signal; a first barrel shifter, receiving data from said first register, said second register and a buffer so as to output data according to a window shift signal and a second control signal, wherein said buffer receives data from said first barrel shifter so as to output data according to a third control signal; a coding table, receiving data from said buffer so as to decode data and output a code-word and a code-length of said code-word; and an adding device, receiving said code-length so as to output said window shift signal and said second control signal according to said third control signal, wherein said buffer comprises: a first multiplexer, receiving data from said first barrel shifter and a third register so as to output data according to said third control signal; and said third register, receiving data from said first multiplexer so as to output data from said buffer.

2. The device as recited in claim 1, wherein said first barrel shifter comprises: a second barrel shifter, receiving external zero data and data from said second register so as to output data according to said second control signal; a third barrel shifter, receiving data from said first and said second register so as to output data according to said window shift signal; and a data selector, receiving data from said second barrel shifter and said third barrel shifter so as to output data according to said second control signal.

3. The device as recited in claim 1, wherein said coding table comprises: a code-word deciding unit, receiving data from said buffer so as to decode data and output said code-word; and a code-length output unit, outputting said code-length of said code-word; wherein said buffer outputs a fourth control signal.

4. The device as recited in claim 3, further comprising: a node, receiving data from said first barrel shifter and said buffer so as to output data; and a second multiplexer, receiving said code-word and data from said node so as to output data according to said fourth control signal.

5. The device as recited in claim 3, wherein said adding device comprises: a second multiplexer, receiving said code-length and an external pre-bitstream so as to output said second control signal according to said third control signal and said fourth control signal; an adder, receiving said second control signal and data from a fourth register so as to output said window shift signal; and said fourth register, receiving data from said adder.

6. The device as recited in claim 5, wherein said external pre-bitstream comprises: a first pre-bitstream; a second pre-bitstream; a third pre-bitstream; and a fourth pre-bitstream.

7. The device as recited in claim 6, wherein said second multiplexer comprises: a third multiplexer, receiving said first pre-bitstream and said second pre-bitstream so as to output data according to a fourth control signal; a fifth multiplexer, receiving said code-length and data from said third multiplexer so as to output data according to said fourth control signal; a fifth register, receiving said data from said fourth multiplexer; a fifth multiplexer, receiving said third pre-bitstream and said fourth pre-bitstream so as to output data according to said fourth control signal; and a sixth multiplexer, receiving data from said fifth register and said fifth multiplexer so as to output said first control signal according to said third control signal.

8. A method for variable length decoding, comprising steps of: installing a buffer on a path from a first barrel shifter to a coding table so as to adjust a critical path during variable length decoding; and using a clock signal so as to control an output clock signal from said buffer.

9. The method as recited in claim 8, further comprising steps of: loading data from a first register and a second register into said first barrel shifter; loading data from said buffer into said first barrel shifter; and selecting data from said first register, said second register and said buffer by window shifting so as to output data to said buffer.

10. The method as recited in claim 9, further comprising a step of: receiving data from said buffer so as to decode said data and output a code-word and a code-length from a coding table.

11. The method as recited in claim 10, further comprising a step of: accumulating said code-length using an adding device so as to control window shifting and data from said first register and said second register.

12. The method as recited in claim 11, further comprising steps of: forming said first barrel shifter using a second barrel shifter, a third barrel shifter and a data selector; receiving date from said buffer and external zero data using said second barrel shifter, and receiving data from said first register and said second register using said third barrel shifter; selecting data from said second barrel shifter and said third barrel shifter using window shifting into said data selector; and outputting data from said data selector controlled by said code-length.

13. The method as recited in claim 12, further comprising a step of: providing a control signal so as to control window shifting when a particular byte occurs during decoding by said coding table.

14. The method as recited in claim 13, comprising a step of: combining data from said first barrel shifter and data from said buffer.

* * * * *